United States Patent
Yamazaki et al.

(10) Patent No.: US 8,772,160 B2
(45) Date of Patent: Jul. 8, 2014

(54) METHOD FOR MANUFACTURING SEMICONDUCTOR ELEMENT AND DEPOSITION APPARATUS

(75) Inventors: Shunpei Yamazaki, Setagaya (JP); Natsuko Takase, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 157 days.

(21) Appl. No.: 13/029,169

(22) Filed: Feb. 17, 2011

(65) Prior Publication Data

US 2011/0212605 A1     Sep. 1, 2011

(30) Foreign Application Priority Data

Feb. 26, 2010   (JP) ................. 2010-043575

(51) Int. Cl.
  H01L 21/44    (2006.01)
  H01L 21/469   (2006.01)
  H01L 21/31    (2006.01)
  H01L 21/324   (2006.01)
  H01L 21/477   (2006.01)

(52) U.S. Cl.
  USPC ........... 438/660; 438/758; 438/765; 438/795; 438/798; 438/799; 257/E21.3; 257/E21.499

(58) Field of Classification Search
  USPC ..................... 257/E21.3, E21.499
  See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,057,234 A | 5/2000 | Yamazaki |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |

(Continued)

FOREIGN PATENT DOCUMENTS

| | | |
|---|---|---|
| CN | 101506986 | 8/2009 |
| EP | 1737044 A | 12/2006 |

(Continued)

OTHER PUBLICATIONS

Hiyama (JP 11-204616), Machine translated on Dec. 15, 2012.*

(Continued)

*Primary Examiner* — Mohsen Ahmadi
(74) *Attorney, Agent, or Firm* — Eric J. Robinson; Robinson Intellectual Property Law Office, P.C.

(57) ABSTRACT

An object of the present invention is to provide an apparatus for successive deposition used for manufacturing a semiconductor element including an oxide semiconductor in which impurities are not included. By using the deposition apparatus capable of successive deposition of the present invention that keeps its inside in high vacuum state, and thus allows films to be deposited without being exposed to the air, the entry of impurities such as hydrogen into the oxide semiconductor layer and the layer being in contact with the oxide semiconductor layer can be prevented; as a result, a semiconductor element including a high-purity oxide semiconductor layer in which hydrogen concentration is sufficiently reduced can be manufactured. In such a semiconductor element, off-state current is low, and a semiconductor device with low power consumption can be realized.

12 Claims, 6 Drawing Sheets

(56) References Cited

U.S. PATENT DOCUMENTS

| | | |
|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,465,674 B2 | 12/2008 | Tamura et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,768,009 B2 | 8/2010 | Kobayashi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0170227 A1* | 7/2009 | Yamazaki et al. ............... 438/26 |
| 2009/0233425 A1 | 9/2009 | Furuno et al. |
| 2009/0278122 A1 | 11/2009 | Hosono et al. |
| 2009/0280600 A1 | 11/2009 | Hosono et al. |
| 2009/0325341 A1 | 12/2009 | Itagaki et al. |
| 2010/0025675 A1 | 2/2010 | Yamazaki et al. |
| 2010/0025676 A1 | 2/2010 | Yamazaki et al. |
| 2010/0025677 A1 | 2/2010 | Yamazaki et al. |
| 2010/0025679 A1 | 2/2010 | Yamazaki et al. |
| 2010/0032665 A1 | 2/2010 | Yamazaki et al. |
| 2010/0032668 A1 | 2/2010 | Yamazaki et al. |
| 2010/0035379 A1 | 2/2010 | Miyairi et al. |
| 2010/0051940 A1 | 3/2010 | Yamazaki et al. |
| 2010/0051949 A1* | 3/2010 | Yamazaki et al. ............... 257/57 |
| 2010/0055832 A1 | 3/2010 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0301328 A1 | 12/2010 | Yamazaki et al. |

FOREIGN PATENT DOCUMENTS

| | | |
|---|---|---|
| EP | 1976018 A | 10/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 10-070089 A | 3/1998 |
| JP | 11-505377 | 5/1999 |
| JP | 11-204616 * | 7/1999 |
| JP | 11-204616 A | 7/1999 |
| JP | 2000-044236 A | 2/2000 |
| JP | 2000-150900 A | 5/2000 |
| JP | 2002-076356 A | 3/2002 |
| JP | 2002-141291 A | 5/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165527 | 6/2006 |
| JP | 2006-165528 | 6/2006 |
| JP | 2006-165529 | 6/2006 |
| JP | 2008-053356 A | 3/2008 |
| JP | 2009-212476 * | 9/2009 |
| JP | 2009-212476 A | 9/2009 |
| JP | 2009-260297 * | 11/2009 |
| JP | 2009-260297 A | 11/2009 |
| KR | 2008-0087744 A | 10/2008 |
| KR | 2009-0057257 A | 6/2009 |
| WO | WO-2004/114391 | 12/2004 |
| WO | WO-2008/023553 | 2/2008 |

OTHER PUBLICATIONS

Furuno et al. (JP 2009-260297), Machine translated on Dec. 15, 2012.*
Nakayama (JP2009-212476), Machine translated on Dec. 15, 2012.*
Hiyama (JP H11-204616), Machine Translated on May 5, 2013.*

(56) References Cited

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID

(56) References Cited

OTHER PUBLICATIONS

Digest '09 : SID International Symposium Digest of Technical Papers, May 31, 2009, pp. 1110-1112.

Ohara.H et al., "21.3:4.0 IN. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1996, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined with Ultra Low-Powder Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura, M. "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YbFe2O4, and Yb2Fe3O7 Types of Structures for Compounds in the In2O3 and Sc2O—A2O3-BO Systems [A; Fe, Ga, or Al; B: Mg, Mn, Fe, Ni, Cu,OR Zn] at Temperatures over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M at al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: a hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), 2003, vol. 21, No. 2, pp. 800-803.

Oh.M et al., "Improving the Gate Stability of Zno Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

International Search Report (Application No. PCT/JP2011/052196) Dated May 10, 2011.

Written Opinion (Application No. PCT/JP2011/052196) Dated May 10, 2011.

* cited by examiner

METHOD FOR MANUFACTURING SEMICONDUCTOR ELEMENT AND DEPOSITION APPARATUS

TECHNICAL FIELD

The present invention relates to a method for manufacturing a semiconductor element including an oxide semiconductor. Further, the present invention relates to an apparatus for successive deposition used for the method for manufacturing a semiconductor element.

BACKGROUND ART

In recent years, semiconductor devices have been developed to be used as an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, or a memory is mounted on a circuit board, for example, a printed wiring board, to be used as one of components of a variety of electronic devices.

In addition, a semiconductor device capable of transmitting and receiving data has been developed. Such a semiconductor device is called a wireless tag, an RFID tag, or the like. Those put into practical use include a semiconductor circuit (IC chip) formed using an antenna and a semiconductor substrate in many cases.

A silicon-based semiconductor material has been known as a semiconductor material that can be used for a transistor; however, an oxide semiconductor has attracted attention as another material. As a material of the oxide semiconductor, zinc oxide or a substance containing zinc oxide is known. In addition, a transistor including an oxide semiconductor having an electron carrier concentration of lower than $10^{18}/cm^3$ is disclosed (Patent Documents 1 to 3).

REFERENCE

[Patent Document 1] Japanese Published Patent Application No. 2006-165527
[Patent Document 2] Japanese Published Patent Application No. 2006-165528
[Patent Document 3] Japanese Published Patent Application No. 2006-165529

DISCLOSURE OF INVENTION

Even when the electron carrier concentration is lower than $10^{18}/cm^3$, the oxide semiconductor is a substantially n-type oxide semiconductor, and the thin film transistors disclosed in the above patent documents does not have a sufficient on/off ratio. The reason for the low on/off ratio of such a thin film transistor is high off-state current. In order to obtain a semiconductor device with low power consumption, extremely low off-state current of a semiconductor element such as a thin film transistor is required.

To reduce off-state current of a transistor to an extremely low level, it is necessary to prevent mixing of impurities such as water, hydrogen or a hydroxyl group into the oxide semiconductor layer and a layer being in contact with the oxide semiconductor layer and to sufficiently reduce hydrogen concentration.

However, in some cases, impurities can not be sufficiently removed from a deposition apparatus used for manufacturing a transistor even when evacuation is performed. Impurities are mixed into a film deposited in such a deposition apparatus.

An example of a unit for removing impurities mixed during deposition into the film is heat treatment. However, adding heat treatment to a manufacturing process of a semiconductor element leads to problems such as an increase in manufacturing steps, which causes an increase in time required to manufacture an element, and an increase in energy consumption for the heat treatment.

Further, it is difficult to completely remove impurities including hydrogen which is mixed during deposition from the film.

An object of one embodiment of the present invention is to provide a method for manufacturing a semiconductor element including an oxide semiconductor into which impurities are not mixed. Further, an object of one embodiment of the present invention is to provide an apparatus for successive deposition used for the method for manufacturing the semiconductor element.

The above problems are caused by impurities being mixed into the film during the deposition. Therefore, the inside of the deposition apparatus is kept ultraclean in the manufacturing process of the semiconductor element, and the semiconductor element is formed by successive deposition without being exposed to the air. Specifically, before and after the deposition, the pressure in the deposition chamber is kept at $10^{-8}$ Pa or less, whereby impurities in the chamber can be removed sufficiently. In such a deposition chamber, an oxide semiconductor film and a film being in contact with the oxide semiconductor film are deposited successively, and the semiconductor element is formed.

Further, in a deposition chamber having an evacuation unit using an entrapment pump and a heating unit for heating at least a wall surface of the periphery of a substrate holding portion, the pressure of less than or equal to $10^{-8}$ Pa can be achieved in the chamber, and impurities in the chamber can be removed sufficiently. Using a deposition apparatus including a plurality of such deposition chambers, a semiconductor element is formed.

One embodiment of the present invention is a deposition apparatus which includes at least a load lock chamber connected to a unit for evacuating the load lock chamber to have a pressure of $10^{-6}$ Pa or less; a plurality of deposition chambers each including a substrate holding portion provided with a first heating unit for heating a substrate, a second heating unit for heating at least a wall surface of a periphery of the substrate holding portion, and a target holding portion for fixing a sputtering target and each being connected to a unit for evacuating the deposition chamber to have a pressure of $10^{-8}$ Pa or less; a heating chamber connected to a unit for evacuating the heating chamber to have a pressure of $10^{-8}$ Pa or less; and a transfer chamber connected to the load lock chamber, the heating chamber, and the plurality of deposition chambers through gate valves and connected to a unit for evacuating the transfer chamber to have a pressure of $10^{-6}$ Pa or less, in which the units for evacuation connected to the load lock chamber, the heating chamber, the plurality of deposition chambers, and the transfer chamber are entrapment pumps.

In the deposition apparatus according to one embodiment of the present invention, it is preferable that at least one of the deposition chambers be provided with a target holding portion for fixing an insulator target, and at least one of the deposition chambers be provided with a target holding portion for fixing a metal oxide target. Alternatively, at least one of the deposition chambers is provided with a target holding portion for fixing a metal oxide target, and at least one of the deposition chambers is provided with a target holding portion for fixing a metal target. Further alternatively, at least one of the deposition chambers is provided with a target holding portion for fixing an insulator target; at least one of the deposition chambers is provided with a target holding portion for fixing a metal oxide target; and at least one of the deposition chambers is provided with a target holding portion for fixing a metal target.

Further, in the deposition apparatus according to one embodiment of the present invention, the amount of leakage of the air from the deposition chamber is preferably $10^{-11}$ Pa·m$^3$/s or less.

In the deposition apparatus according to one embodiment of the present invention, the first heating unit has a unit for depositing a film while heating the substrate at room temperature to 500° C. inclusive.

The deposition apparatus according to one embodiment of the present invention preferably includes a treatment chamber provided with a unit for generating an oxygen radical and a unit for evacuating the chamber to have a pressure of $10^{-8}$ Pa or less.

The deposition apparatus according to one embodiment of the present invention preferably includes a heating chamber provided with a unit for heating at room temperature to 700° C. inclusive.

One embodiment of the present invention is a method for manufacturing a semiconductor element comprising the steps of transferring a substrate into a load lock chamber; evacuating the load lock chamber to have a pressure of $10^{-6}$ Pa or less; transferring the substrate into a heating chamber evacuated to have a pressure of $10^{-8}$ Pa or less; performing heat treatment on the substrate; transferring the substrate into a deposition chamber evacuated to have a pressure of $10^{-8}$ Pa or less; introducing a high-purity sputtering gas into the deposition chamber and forming a gate insulating film over the substrate by a sputtering method; evacuating the deposition chamber to have a pressure of $10^{-8}$ Pa or less; transferring the substrate into a deposition chamber evacuated to have a pressure of $10^{-8}$ Pa or less; and introducing a high-purity sputtering gas into the deposition chamber and forming an oxide semiconductor film over the gate insulating film by a sputtering method.

Another embodiment of the present invention is a method for manufacturing a semiconductor element comprising the steps of transferring a substrate into a load lock chamber; evacuating the load lock chamber to have a pressure of $10^{-6}$ Pa or less; transferring the substrate into a heating chamber evacuated to have a pressure of $10^{-8}$ Pa or less; performing heat treatment on the substrate; transferring the substrate into a deposition chamber evacuated to have a pressure of $10^{-8}$ Pa or less; introducing a high-purity sputtering gas into the deposition chamber and forming an oxide semiconductor film over the substrate by a sputtering method; evacuating the deposition chamber to have a pressure of $10^{-8}$ Pa or less; transferring the substrate into a deposition chamber evacuated to have a pressure of $10^{-8}$ Pa or less; and introducing a high-purity sputtering gas into the deposition chamber and forming a conductive film over the oxide semiconductor film by a sputtering method.

Another embodiment of the present invention is a method for manufacturing a semiconductor element comprising the steps of transferring a substrate into a load lock chamber; evacuating the load lock chamber to have a pressure of $10^{-6}$ Pa or less; transferring the substrate into a heating chamber evacuated to have a pressure of $10^{-8}$ Pa or less; performing heat treatment on the substrate; transferring the substrate into a deposition chamber evacuated to have a pressure of $10^{-8}$ Pa or less; introducing a high-purity sputtering gas into the deposition chamber and forming a gate insulating film over the substrate by a sputtering method; evacuating the deposition chamber to have a pressure of $10^{-8}$ Pa or less; transferring the substrate into a deposition chamber evacuated to have a pressure of $10^{-8}$ Pa or less; introducing a high-purity sputtering gas into the deposition chamber and forming an oxide semiconductor film over the gate insulating film by a sputtering method; evacuating the deposition chamber to have a pressure of $10^{-8}$ Pa or less; transferring the substrate into a deposition chamber evacuated to have a pressure of $10^{-8}$ Pa or less; and introducing a high-purity sputtering gas into the deposition chamber and forming a conductive film over the oxide semiconductor film by a sputtering method.

In the above method for manufacturing a semiconductor element, it is preferable that the substrate be transferred to the treatment chamber evacuated to have a pressure of $10^{-8}$ Pa or less and oxygen radical treatment be performed on the oxide semiconductor film after the oxide semiconductor film is formed and the deposition chamber is evacuated to have a pressure of $10^{-8}$ Pa or less.

Another embodiment of the present invention is a method for manufacturing a semiconductor element comprising the steps of transferring a substrate into a load lock chamber; evacuating the load lock chamber to have a pressure of $10^{-6}$ Pa or less; transferring the substrate into a heating chamber evacuated to have a pressure of $10^{-8}$ Pa or less; performing heat treatment on the substrate; transferring the substrate into a deposition chamber evacuated to have a pressure of $10^{-8}$ Pa or less; introducing a high-purity sputtering gas into the deposition chamber and forming a first oxide semiconductor film over the substrate by a sputtering method; evacuating the deposition chamber to have a pressure of $10^{-8}$ Pa or less; transferring the substrate into a heating chamber evacuated to have a pressure of $10^{-8}$ Pa or less; performing heat treatment on the substrate; transferring the substrate into a deposition chamber evacuated to have a pressure of $10^{-8}$ Pa or less; introducing a high-purity sputtering gas into the deposition chamber and forming a second oxide semiconductor film over the substrate by a sputtering method; evacuating the deposition chamber to have a pressure of $10^{-8}$ Pa or less; transferring the substrate into a heating chamber evacuated to have a pressure of $10^{-8}$ Pa or less; performing heat treatment on the substrate; transferring the substrate into a treatment chamber evacuated to have a pressure of $10^{-8}$ Pa or less; and performing oxygen radical treatment on the second oxide semiconductor film.

Another embodiment of the present invention is a method for manufacturing a semiconductor element comprising the steps of transferring a substrate into a load lock chamber; evacuating the load lock chamber to have a pressure of $10^{-6}$ Pa or less; transferring the substrate into a heating chamber evacuated to have a pressure of $10^{-8}$ Pa or less; performing heat treatment on the substrate; transferring the substrate into a deposition chamber evacuated to have a pressure of $10^{-8}$ Pa or less; introducing a high-purity sputtering gas into the deposition chamber and forming a first oxide semiconductor film over the substrate by a sputtering method while performing heat treatment on the substrate; evacuating the deposition chamber to have a pressure of $10^{-8}$ Pa or less; transferring the substrate into a deposition chamber evacuated to have a pressure of $10^{-8}$ Pa or less; introducing a high-purity sputtering gas into the deposition chamber and forming a second oxide semiconductor film over the substrate by a sputtering method; evacuating the deposition chamber to have a pressure of $10^{-8}$ Pa or less; transferring the substrate into a heating chamber evacuated to have a pressure of $10^{-8}$ Pa or less; and performing heat treatment on the substrate.

According to one embodiment of the present invention, a method for manufacturing a semiconductor element including an oxide semiconductor into which impurities are not mixed can be provided. In addition, according to one embodiment of the present invention, an apparatus for successive deposition used for the method for manufacturing the semiconductor element can be provided.

BEST MODE FOR CARRYING OUT THE INVENTION

Figure 1:
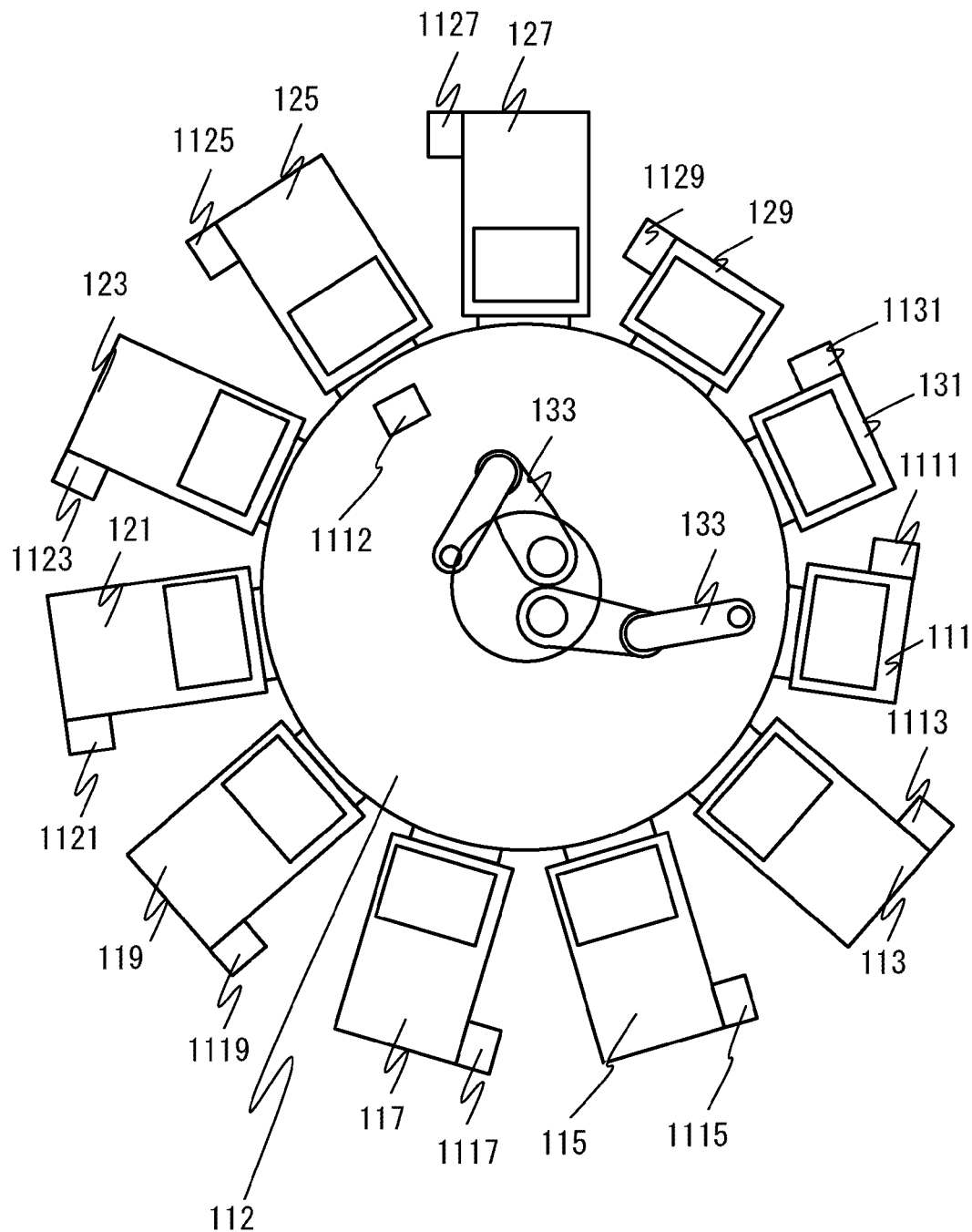
FIG. 1 is a diagram illustrating an apparatus for successive deposition according to one embodiment of the present invention.

Hereinafter, embodiments of the present invention are described with reference to the accompanying drawings. Note that the invention disclosed in this specification is not limited to the following description because it will be easily understood by those skilled in the art that various changes and modifications can be made without departing from the spirit and scope of the present invention. Therefore, the present invention disclosed should not be construed as being limited to the description below of embodiments and examples. In the drawings for explaining the embodiments, the same parts or parts having a similar function are denoted by the same reference numerals, and description of such parts is not repeated.

Embodiment 1

In this embodiment, a deposition apparatus according to one embodiment of the present invention will be described with reference to the drawings.

FIG. 1 is a schematic top view of an apparatus for successive deposition of this embodiment.

The apparatus for successive deposition illustrated in FIG. 1 includes a first load lock chamber 111, a transfer chamber 112, a plurality of deposition chambers (which correspond to a first deposition chamber 113, a second deposition chamber 115, a third deposition chamber 117, a fourth deposition chamber 121, and a fifth deposition chamber 127 in FIG. 1), heating chambers (which correspond to a first heating chamber 119 and a second heating chamber 123 in FIG. 1), a treatment chamber 125, a substrate standby chamber 129, a second load lock chamber 131, and a substrate transfer unit 133. Although not illustrated, the apparatus for successive deposition of this embodiment includes a unit for heating the inner wall of the apparatus at higher than or equal to 300° C.

The first load lock chamber 111, the transfer chamber 112, the deposition chambers, the heating chambers, the treatment chamber 125, the substrate standby chamber 129, and the second load lock chamber 131 are connected to evacuation units 1111 to 1131, respectively.

The first load lock chamber 111, the transfer chamber 112, and the second load lock chamber 131 are connected to the evacuation units which are units for evacuating the chambers to have a pressure of $10^{-6}$ Pa or less, preferably, $10^{-8}$ Pa or less as an evacuation unit. The evacuation units are selected in accordance with the application of each chamber. The evacuation units may be the one provided with an entrapment pump, a turbo pump provided with a cold trap, or the like. In particular, the evacuation unit is preferably provided with the entrapment pump. An example of the entrapment pump is a pump provided with an entrapment unit such as a cryopump, a sputtering ion pump, or a titanium sublimation pump.

The deposition chambers, the heating chambers, and the treatment chamber are connected to the evacuation units which are units for evacuating the chambers to have a pressure of greater than or equal to $10^{-12}$ Pa and less than or equal to $10^{-8}$ Pa. By using the evacuation units and the unit for heating the inner wall of the apparatus at higher than or equal to 300° C., the pressure of each chamber can be greater than or equal to $10^{-12}$ Pa and less than or equal to $10^{-8}$ Pa. By setting the pressure of each chamber at greater than or equal to $10^{-12}$ Pa and less than or equal to $10^{-8}$ Pa, impurities in the chamber can be removed sufficiently. As the evacuation units, the above-described entrapment pumps are used.

In this embodiment, the first load lock chamber 111 is a chamber in which a substrate holder which stores an untreated substrate is placed, and the second load lock chamber 131 is a chamber in which a substrate holder which stores a treated substrate is placed. However, the deposition apparatus according to one embodiment of the present invention is not limited thereto, and carrying out and carrying in of the substrate may be performed with one load lock chamber.

The transfer chamber 112 serves as a delivery chamber for transferring a substrate from one chamber to another chamber.

The heating chambers (the first heating chamber 119 and the second heating chamber 123) each include a unit for heating a substrate. The apparatus for successive deposition of this embodiment has two heating chambers; however, the number of heating chambers may be an arbitrary number which is one or more.

The treatment chamber 125 is a chamber in which oxygen radical treatment can be performed. Oxygen radicals may be supplied by a plasma generating apparatus including oxygen or an ozone generating apparatus. By exposing a thin film to the supplied oxygen radicals or oxygen, the surface of the film can be modified. Further, the treatment performed in the treatment chamber is not limited to the oxygen radical treatment. In the apparatus for successive deposition, the treatment chamber is not necessarily provided, or a plurality of treatment chambers may be provided.

The substrate standby chamber 129 is a chamber in which a substrate in a process of successive deposition can be in a standby state. The substrate standby chamber 129 may have a cooling unit. By providing the cooling unit, a substrate which has been heated for the deposition or the like can be cooled sufficiently. The cooling may be performed by introducing helium, neon, argon, or the like into the substrate standby chamber 129. Note that it is preferable that water, hydrogen, or the like be not contained in nitrogen or a rare gas such as helium, neon, or argon which is used for the cooling. The purity of nitrogen or a rare gas such as helium, neon, or argon is preferably 6N (99.9999%) or more, more preferably 7N (99.99999%) or more (that is, the concentration of impurities is 1 ppm or less, preferably 0.1 ppm or less). In the apparatus for successive deposition, the substrate standby chamber is not necessarily provided.

The apparatus for successive deposition according to one embodiment of the present invention includes a plurality of deposition chambers. Before and after the deposition, the pressure in each of the deposition chambers is kept at $10^{-8}$ Pa or less. As evacuation units to achieve this, the above-described entrapment pumps are used. The amount of leakage of the air from the deposition chamber is preferably $10^{-11}$ Pa·m³/s or less.

The apparatus for successive deposition in FIG. 1 includes five deposition chambers (the first deposition chamber 113, the second deposition chamber 115, the third deposition chamber 117, the fourth deposition chamber 121, and the fifth deposition chamber 127); however the number of the deposition chambers is not limited thereto, and can be determined as appropriate depending on the number of films for successive deposition.

Figure 2:
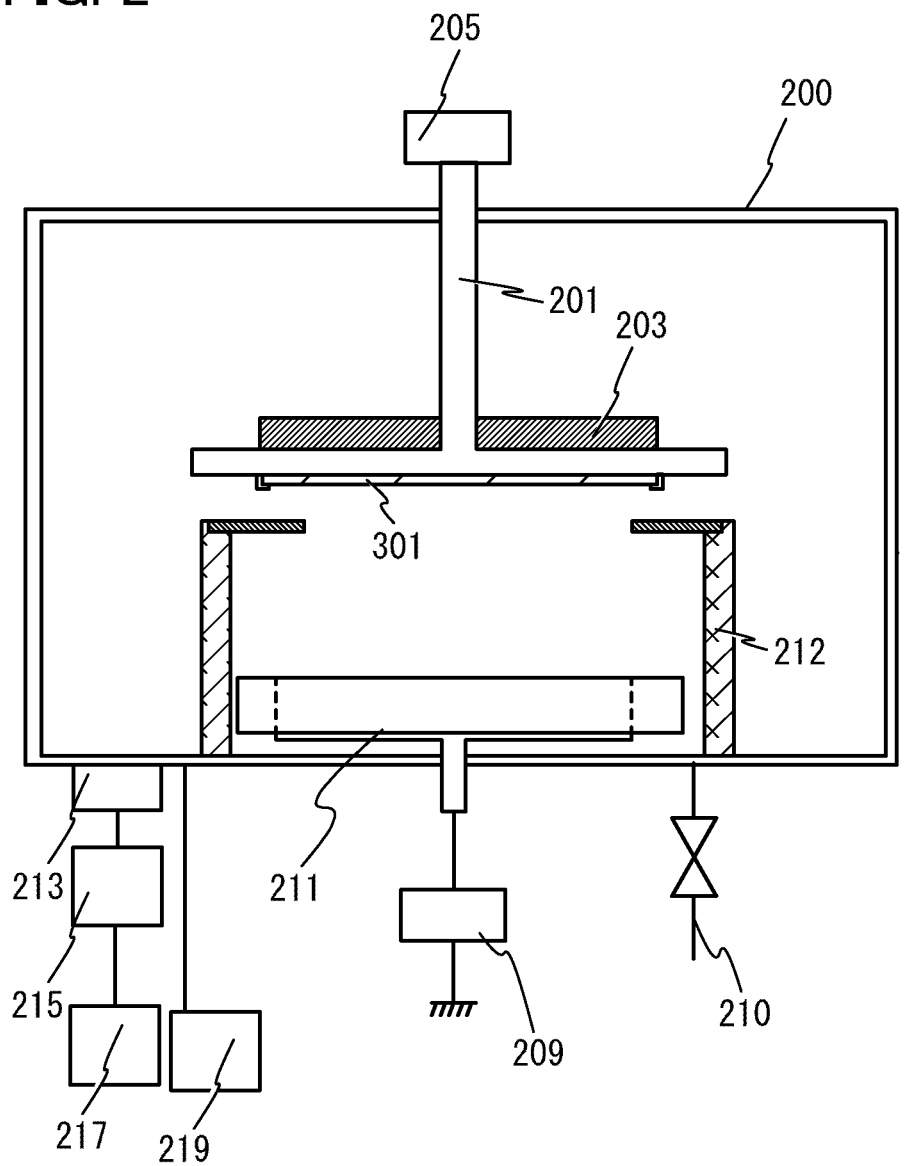
FIG. 2 is a diagram illustrating a deposition chamber according to one embodiment of the present invention.

In the deposition chambers, equipment capable of deposition using a method in accordance with a kind of a film to be formed, such as a sputtering method, a vacuum evaporation method, or a plasma CVD method may be provided as appropriate. Although the pressure in the deposition chamber during the deposition can be optimized in accordance with a deposition method and a material for the deposition, the pressure of each of the deposition chambers is kept at $10^{-8}$ Pa or less before and after the deposition. A specific example of a structure of the deposition chamber is illustrated in FIG. 2. In this embodiment, a deposition chamber in which deposition is performed using a sputtering method is described as an example.

In FIG. 2, the deposition chamber 200 includes a substrate holding portion 201, a substrate heating unit 203, a substrate rotating unit 205, a power source 209, a gas introduction unit 210, a sputtering target 211 which is held at a target holding portion, an attachment protection plate 212, a main valve 213, an automatic pressure controlling device 215, a cryopump 217, and a drypump 219.

By the substrate transfer unit 133 (see FIG. 1), a substrate 301 is transferred from one chamber included in the apparatus for successive deposition to the substrate holding portion 201 in the deposition chamber 200 through the transfer chamber 112. A substrate holder (not illustrated) in the substrate holding portion 201 is moved vertically by a vertical driving mechanism and can fix the substrate. As illustrated in FIG. 2, it is preferable to adopt a face-down manner (a manner in which deposition is performed while a surface to be subjected to deposition of a substrate points downward) because attachment of dust or the like to the substrate 301 can be suppressed.

The substrate holding portion 201 has the substrate heating unit 203. As the substrate heating unit 203, a unit for heating an object to be processed by heat conduction or heat radiation from a heater such as a resistance heater, or a unit for heating an object to be processed by radiation of light (an electromagnetic wave) emitted from a lamp may be used. The deposition can be performed while the substrate 301 is heated by the substrate heating unit 203.

During the deposition, the substrate 301 is preferably rotated using the substrate rotating unit 205 to improve uniformity of films.

The deposition chamber 200 includes a unit (not shown) for heating at least a wall surface around the substrate holding portion 201. The inner wall of the deposition chamber is heated regularly, and impurities adsorbed onto the inner wall can be detached; accordingly, a high vacuum state can be achieved.

In the deposition chamber 200 of this embodiment, deposition is performed using a sputtering method. As the sputtering target 211, for example, a target for forming an oxide insulating layer, a target for forming a nitride insulating layer, a target for forming an oxide semiconductor layer, a target for forming a conductive layer, or the like can be used. Specifically, an insulator target, a metal oxide target, a metal target, or the like can be used. A shutter (not shown) is provided between the sputtering target 211 and the substrate 301.

A sputtering method may be either a DC (direct current) sputtering method or an RF (radio frequency) sputtering method. For example, in the deposition chamber 200, an RF sputtering method is used in the case where an insulating layer is deposited, and a DC sputtering method is used in the case where a conductive layer of metal is deposited.

As the material of the attachment protection plate 212, metal such as iron, aluminum, or stainless steel can be used.

The deposition chamber 200 is connected to evacuation units which are the cryopump 217, and the drypump 219. In addition, a sputtering ion pump may be used together. Using the evacuation units, the pressure in the deposition camber 200 can be kept at $10^{-8}$ Pa or less before and after the deposition. A high-purity gas is used as a gas to be introduced in order to prevent impurities from being introduced into the deposition chamber 200. The gas which is introduced into the deposition chamber 200 is highly purified by a gas refiner before being introduced into the apparatus. Accordingly, a gas refiner needs to be provided so that a gas may be introduced into the deposition apparatus after it is highly purified. Accordingly, impurities such as water in the gas can be removed beforehand to prevent these impurities from being introduced into the apparatus.

As described above, the apparatus for successive deposition of this embodiment includes deposition chambers each of which is connected to an evacuation unit using an entrapment pump and each of which has a heating unit for heating at least a wall surface of the periphery of a substrate holding portion so that the pressure in the chamber can be less than or equal to $10^{-8}$ Pa. By setting the pressure in the chamber less than or equal to $10^{-8}$ Pa before and after the deposition, impurities in the chamber can be removed sufficiently. By using an apparatus for successive deposition including such deposition chambers to perform successive deposition without exposure to the air, impurities are not mixed into the oxide semiconductor and a layer being in contact with the oxide semiconductor layer, whereby a semiconductor element including the high-purity oxide semiconductor layer in which hydrogen concentration is sufficiently reduced can be manufactured. The off-state current of such a semiconductor element is low, so that a semiconductor device with low power consumption can be realized.

Embodiment 2

In this embodiment, a method for manufacturing a bottom gate transistor using the apparatus for successive deposition in Embodiment 1 will be described with reference to FIG. 1, FIG. 3A, and FIGS. 4A to 4E. In this embodiment, a method for manufacturing a semiconductor element including an oxide semiconductor layer will be described.

The semiconductor element illustrated in this embodiment includes a highly purified oxide semiconductor layer. With the use of the deposition apparatus illustrated in Embodiment 1, the oxide semiconductor can be highly purified so as to contain impurities that are not main components of the oxide semiconductor as little as possible, and an i-type (intrinsic) or substantially i-type (intrinsic) oxide semiconductor can be obtained. In other words, a highly purified i-type (intrinsic) oxide semiconductor, or an oxide semiconductor close thereto, is obtained not by adding an impurity but by preventing an impurity such as hydrogen or water from being contained in the semiconductor as much as possible. Thus, the transistor manufactured in this embodiment includes an oxide semiconductor layer which is highly purified and made to be electrically i-type (intrinsic).

The number of carriers in the highly purified oxide semiconductor can be significantly small (close to zero). Specifically, the carrier concentration can be reduced to less than $1\times10^{12}/cm^3$, preferably less than $1\times10^{11}/cm^3$. Further, the hydrogen concentration in the highly purified oxide semiconductor is less than $1\times10^{16}$ atoms/$cm^3$.

With the use of the deposition apparatus illustrated in Embodiment 1, the number of carriers in the oxide semiconductor can be significantly small. A transistor in which such a highly purified oxide semiconductor layer is used for a channel formation region can have a reduced off-state current. Note that it is preferable that off-state current be as low as possible because power consumption can be reduced.

Figure 3A:
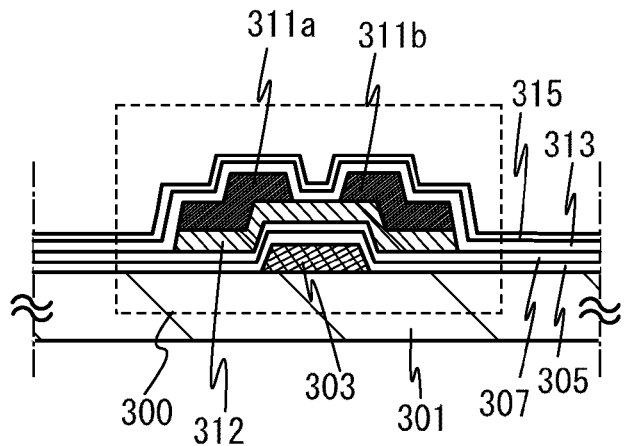
FIGS. 3A to 3C are diagrams illustrating a transistor which is manufactured by a manufacturing method according to one embodiment of the present invention.

A cross-sectional view of a bottom gate transistor 300 in this embodiment is illustrated in FIG. 3A. The transistor 300 includes a gate electrode layer 303, a first gate insulating layer 305, a second gate insulating layer 307, a highly purified oxide semiconductor layer 312, a source electrode layer 311a, a drain electrode layer 311b, an insulating layer 313, and a protective insulating layer 315.

A method for manufacturing the transistor 300 with the use of the deposition apparatus illustrated in Embodiment 1 will be described with reference to FIGS. 4A to 4E.

Figure 4A:
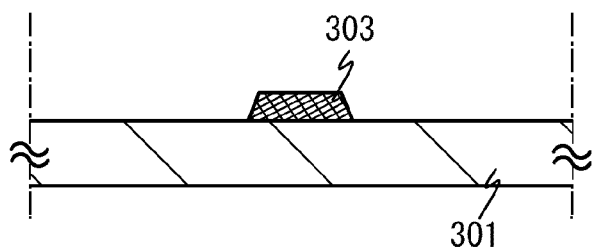
FIGS. 4A to 4E are diagrams illustrating a method for manufacturing a transistor according to one embodiment of the present invention.

First, a conductive film is formed over the substrate 301; a resist mask is formed using a first photomask; and etching is performed, whereby the gate electrode layer 303 is formed (FIG. 4A).

Although there is no particular limitation on a substrate used for the substrate 301, a glass substrate of barium borosilicate glass, aluminoborosilicate glass, or the like can be used.

The gate electrode layer 303 can be formed in a single layer or a stacked layer using a metal material such as molybdenum, titanium, chromium, tantalum, tungsten, aluminum, copper, neodymium, or scandium, or an alloy material which includes any of these materials as a main component.

With the use of the apparatus for successive deposition (see FIG. 1) in Embodiment 1, the gate insulating layer, the oxide semiconductor layer, and the conductive layer can be deposited successively without being exposed to the air.

First, the substrate 301 over which the gate electrode layer 303 is formed is carried in the first load lock chamber 111 in the apparatus for successive deposition. Then, the pressure in the first load lock chamber 111 is reduced using the evacuation unit 1111. At that time, the first load lock chamber is evacuated until the pressure becomes $10^{-6}$ Pa or less, preferably, $10^{-8}$ Pa or less.

In the apparatus for successive deposition, the substrate 301 is transferred from a chamber to another chamber through the transfer chamber 112. The pressure in the transfer chamber 112 is kept at $10^{-6}$ Pa or less, preferably, $10^{-8}$ Pa or less using the evacuation unit 1112 such as a cryopump. Further, the inner wall of the apparatus is heated regularly, and impurities adsorbed onto the inner wall are detached; accordingly, a high vacuum state can be achieved.

The substrate 301 is transferred to the heating chamber (the first heating chamber 119 or the second heating chamber 123) using the substrate transfer unit 133, and a gate valve which is used as a partition between the heating chamber and the transfer chamber 112 is closed. The heating chamber is kept at $10^{-8}$ Pa or less using the evacuation unit such as a cryopump. Next, preheating is performed. By performing the preheating, impurities adsorbed onto the substrate 301 can be detached and removed from the heating chamber. Examples of the impurities are a hydrogen atom, a compound containing a hydrogen atom such as $H_2O$, a compound containing a carbon atom, and the like. The temperature for the preheating is from room temperature to 600° C. inclusive, preferably from 100° C. to 400° C. inclusive.

Next, the substrate 301 is transferred to the first deposition chamber 113 using the substrate transfer unit 133. Then, a high-purity sputtering gas is introduced while the pressure in the first deposition chamber 113 is controlled using the evacuation unit 1113 such as cryopump, and a silicon nitride film which is to be as the first gate insulating layer 305 is deposited over the gate electrode layer 303 by a sputtering method. After the deposition, the pressure in the first deposition chamber 113 is evacuated again to have a pressure of $10^{-8}$ Pa or less using the evacuation unit 1113, and the inside of the first deposition chamber 113 is kept clean. Impurities contained in the first gate insulating layer 305 is effectively reduced because the first gate insulating layer 305 is deposited in the deposition chamber which is kept clean by being evacuated to have a pressure of $10^{-8}$ Pa or less before and after the deposition.

Next, the substrate 301 is transferred from the first deposition chamber 113 to the second deposition chamber 115. Then, a silicon oxide film is deposited over the first gate insulating layer 305 by a sputtering method in a manner similar to the first gate insulating layer 305, thereby forming the second gate insulating layer 307. Before and after the deposition, the pressure in the second deposition chamber 115 is kept at $10^{-8}$ Pa or less by using the evacuation unit 1115 such as a cryopump.

The oxide semiconductor layer used in this embodiment, which is made to be intrinsic (i-type) or substantially intrinsic is highly sensitive to an interface state and interface charge; thus, an interface between the oxide semiconductor layer and the gate insulating layer is important. Therefore, the second gate insulating layer 307 that is in contact with the highly-purified oxide semiconductor needs to have higher quality. The first deposition chamber 113 and the second deposition chamber 115 are evacuated by a cryopump and the like, and the impurity concentration in the deposition chambers is extremely low. The silicon nitride film and the silicon oxide film stacked in the deposition chambers in which impurities are reduced serve as gate insulating layers with reduced impurity concentration.

In this embodiment, the gate insulating layer is formed to have a stacked structure of a silicon nitride film and a silicon oxide film; however, the gate insulating layer is not limited thereto. The gate insulating layer can have a single-layer or stacked structure including a silicon nitride film, a silicon oxide film, a silicon oxynitride film, a silicon nitride oxide film, an aluminum oxide film, or the like. An oxide insulating film is preferably used as a layer in contact with the oxide semiconductor layer to be formed later. The insulating layer can be formed by a plasma CVD method, a sputtering method, or the like. In order to prevent the insulating layer from containing a large amount of hydrogen, the insulating layer is preferably deposited by a sputtering method. There is no particular limitation on the thickness of the gate insulating layer; the thickness can be greater than or equal to 10 nm and less than or equal to 500 nm, for example.

Next, the substrate 301 is transferred from the second deposition chamber 115 to the third deposition chamber 117, and an oxide semiconductor film 309 is deposited over the second gate insulating layer 307 by a sputtering method. Before and after the deposition, the pressure in the third deposition chamber 117 is kept at $10^{-8}$ Pa or less using an evacuation unit 1117 such as a cryopump, and the inside of the third deposition chamber 117 is kept extremely clean. Impurities contained in the oxide semiconductor film 309 are effectively reduced because the oxide semiconductor film 309 is deposited in the deposition chamber which is kept clean before and after the deposition.

As an oxide semiconductor used for the oxide semiconductor layer 309, an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor, a Sn—O-based oxide semiconductor, or a Zn—O-based oxide semiconductor which are single-component metal oxides can be used. In addition, the above oxide semiconductor film may contain $SiO_2$. Here, for example, the In—Ga—Zn—O-based oxide semiconductor means an oxide containing at least In, Ga, and Zn, and the composition ratio of the elements is not particularly limited. The In—Ga—Zn—O-based oxide semiconductor may contain an element other than In, Ga, and Zn.

As the above oxide semiconductor film 309, a thin film represented by $InMO_3(ZnO)_m$ (m>0 and m is not a natural number) can be used. Here, M represents one or more metal elements selected from Ga, Al, Mn, and Co. For example, M can be Ga, Ga and Al, Ga and Mn, Ga and Co, or the like.

Figure 4B:
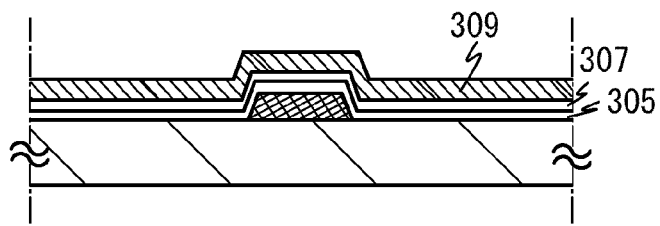

In this embodiment, the oxide semiconductor film 309 is deposited with a sputtering method with the use of an In—Ga—Zn—O-based oxide target. A cross-sectional view of this stage is illustrated in FIG. 4B. The oxide semiconductor film 309 can be formed in a rare gas (typically, argon) atmosphere, an oxygen atmosphere, or a mixed atmosphere of a rare gas and oxygen.

As a target for forming the oxide semiconductor film 309 by a sputtering method, for example, a target with the following composition ratio can be used: the composition ratio of $In_2O_3:Ga_2O_3:ZnO$ is 1:1:1 [molar ratio] (i.e., In:Ga:Zn=1:1:0.5 [atomic ratio]). Alternatively, a target having a composition ratio of $In_2O_3:Ga_2O_3:ZnO=1:1:2$ [molar ratio] (that is, In:Ga:Zn=1:1:1 [atomic ratio]) or $In_2O_3:Ga_2O_3:ZnO=1:1:4$ [molar ratio] (that is, In:Ga:Zn=1:1:2 [atomic ratio]) can also be used. The filling rate of the oxide target is 90.0% to 100% inclusive, preferably, 95.0% to 99.9% inclusive. With the use of a metal oxide target with high filling rate, the deposited oxide semiconductor film has high density.

A high-purity gas in which impurities such as hydrogen, water, a hydroxyl group, and hydride are removed is used as the sputtering gas for the deposition of the oxide semiconductor film 309.

As one example of the deposition conditions, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current power source is preferably used, in which case powder substances (also referred to as particles or dust) that are generated in deposition can be reduced and the film thickness can be uniform.

For example, with the use of the apparatus for successive deposition in Embodiment 1, an oxide semiconductor film with a thickness of greater than or equal to 2 nm and less than or equal to 200 nm can be deposited in 10 minutes in the third deposition chamber 117.

After the oxide semiconductor film 309 is formed, oxygen radical treatment is preferably performed on the oxide semiconductor film 309. In this embodiment, oxygen radical treatment is performed in the treatment chamber 125. Before and after the treatment, the pressure in the treatment chamber 125 is kept at $10^{-8}$ Pa or less using an evacuation unit 1125 such as a cryopump.

Oxygen radicals may be supplied by a plasma generating apparatus including oxygen or an ozone generating apparatus. By exposing a thin film to the produced oxygen radicals or oxygen, the surface of the film can be modified. Instead of the oxygen radical treatment, radical treatment may be performed using argon and oxygen radicals. The treatment using argon and oxygen radicals is treatment in which argon gas and oxygen gas are introduced to generate plasma, thereby modifying the surface of a thin film.

An example of the treatment using argon and oxygen radicals is described. Argon atoms (Ar) in a reaction space where an electric field is applied to generate discharge plasma are excited or ionized by electrons in the discharge plasma, thereby being converted into argon radicals (Ar*), argon ions ($Ar^+$), or electrons. Argon radicals (Ar*), which are in a high-energy metastable state, react with the peripheral atoms of the same kind or of different kinds to be returned to a stable state by exciting or ionizing the atoms, whereby a reaction occurs like an avalanche. If oxygen exists in the periphery at that time, oxygen atoms (O) are excited or ionized to be converted into oxygen radicals (O*), oxygen ions ($O^+$), or the like. The oxygen radicals (O*) react with a material on the surface of a thin film that is to be processed, so that the surface is modified, and the oxygen radicals also react with an organic substance on the surface, so that plasma treatment to remove the organic substance is performed. Note that radicals of an inert gas have the properties of being kept in a metastable state for a longer time than radicals of reactive gas (oxygen gas); accordingly, an inert gas is generally used to generate plasma.

Figure 4C:
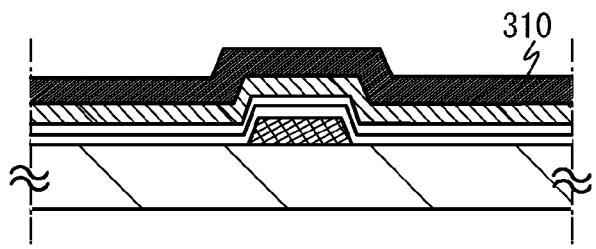

Next, the substrate 301 is transferred to the fifth deposition chamber 127, and a conductive film 310 is deposited over the oxide semiconductor film 309 by a sputtering method (FIG. 4C). Before and after the deposition, the pressure in the fifth deposition chamber 127 is kept at $10^{-8}$ Pa or less using an evacuation unit 1127 such as a cryopump.

Further, as a material for the conductive film, an element selected from Al, Cr, Cu, Ta, Ti, Mo, and W, an alloy including the above element, an alloy including any of these elements in combination, or the like can be used, for example. Further, a structure may be employed in which a high-melting-point metal film of Ti film, Mo film, W film, or the like is stacked on one or both of a top surface and a bottom surface of a metal film of Al film, Cu film, or the like. In addition, heat resistance can be improved by using an Al material to which an element (such as Si, Nd, or Sc) which prevents generation of a hillock or a whisker in an Al film is added. The conductive film may be formed using a conductive metal oxide. As the conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO), indium oxide-zinc oxide alloy ($In_2O_3$—ZnO), or any of these metal oxide materials in which silicon oxide is contained can be used.

Then, the substrate 301 which has been subjected to successive deposition is transferred to the second load lock chamber 131.

In the process of successive deposition, in the case where a substrate transferred from one chamber is required to be in standby mode before being transferred into another chamber where next deposition and treatment is performed, the substrate can be transferred in the substrate standby chamber 129. The pressure in the substrate standby chamber 129 is kept at $10^{-8}$ Pa or less using an evacuation unit 1129 such as a cryopump.

Figure 4D:
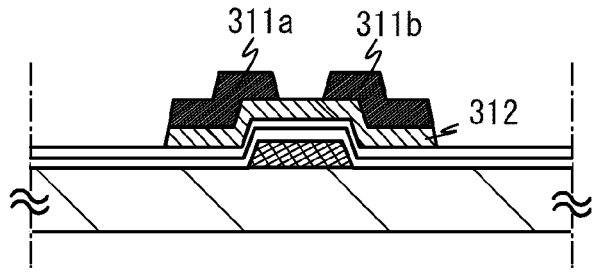

Next, a resist mask is formed using a second photomask over the conductive film 310, and unnecessary portions of the conductive film 310 and the oxide semiconductor film 309 are removed by etching. Then, using a third photomask, the conductive film overlapping with the channel formation region of the oxide semiconductor layer is etched so that the source electrode layer 311a and the drain electrode layer 311b are formed (FIG. 4D).

Next, the substrate may be transferred into the deposition apparatus again, and plasma treatment may be performed using a gas such as $N_2O$, $N_2$, or Ar so that water or the like adsorbed to a surface of an exposed portion of the oxide semiconductor layer is removed. In the case where the plasma treatment is performed, the insulating layer 313 is formed as a protective insulating film in contact with part of the oxide semiconductor layer without being exposed to the air.

The insulating layer 313 can be formed to a thickness of at least 1 nm by a method by which impurities such as water or hydrogen are not mixed into the insulating layer 313, such as a sputtering method as appropriate. When hydrogen is contained in the insulating layer 313, the entry of the hydrogen into the oxide semiconductor layer or the extraction of oxygen in the oxide semiconductor layer by hydrogen is caused, thereby making the resistance of the backchannel of the oxide semiconductor layer low (to have an n-type conductivity), so that a parasitic channel might be formed. Therefore, it is important that a deposition method in which hydrogen is not used be employed in order that the insulating layer 313 contains as little hydrogen as possible.

As in the case of depositing the oxide semiconductor film, the pressure in the deposition chamber for depositing the insulating layer 313 is kept at $10^{-8}$ Pa or less using an evacuation unit such as a cryopump before and after the deposition.

The insulating layer 313 which is formed in contact with the oxide semiconductor layer is formed using an inorganic insulating film that does not contain impurities such as moisture, hydrogen, and a hydroxyl group and blocks the entry of such impurities from the outside; in particular, an oxide insulating film is preferably used. The insulating layer 313 is typically formed using a silicon oxide film, a silicon oxynitride film, an aluminum oxide film, an aluminum oxynitride film or the like.

In this embodiment, a 200-nm-thick silicon oxide film is deposited as the insulating layer 313 by a sputtering method. The substrate temperature at the time of deposition is from room temperature to 500° C. inclusive. The silicon oxide film can be formed with a sputtering method in a rare gas (typically argon) atmosphere, an oxygen atmosphere, or a mixed atmosphere containing a rare gas and oxygen. It is preferable that a high-purity gas from which impurities such as hydrogen, water, a hydroxyl group, and hydride are removed be used as the sputtering gas for the deposition of the insulating layer 313. As a target for sputtering, a silicon oxide target or a silicon target can be used. For example, a silicon oxide film can be formed by a sputtering method using a silicon target in an atmosphere containing oxygen.

Figure 4E:
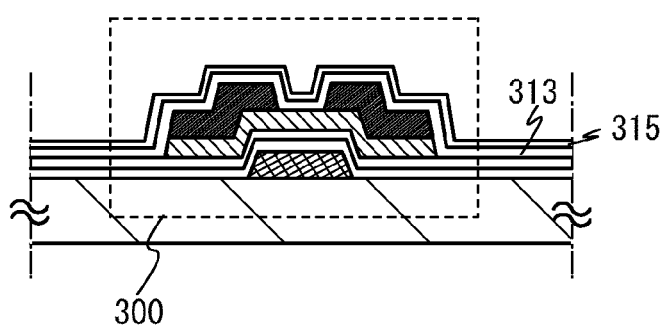

A protective insulating layer 315 may be formed over the insulating layer 313. For example, a silicon nitride film is formed by an RF sputtering method. Since an RF sputtering method has high productivity, it is preferably used as a deposition method of the protective insulating layer. As the protective insulating layer, an inorganic insulating film which does not include an impurity such as moisture and prevents entry of these from the outside, such as a silicon nitride film or an aluminum nitride film is used. In this embodiment, the protective insulating layer 315 is formed using a silicon nitride film (FIG. 4E).

As in the case where the insulating layer 313 is formed, the pressure in the deposition chamber for depositing the protective insulating layer 315 is kept at $10^{-8}$ Pa or less using an evacuation unit such as a cryopump before and after the deposition.

Through the above-described steps, the transistor 300 is formed.

As described above, by manufacturing a transistor using an apparatus for successive deposition in Embodiment 1, impurities are not mixed into the oxide semiconductor layer and a layer being in contact with the oxide semiconductor layer, whereby a semiconductor element including a high-purity oxide semiconductor layer in which hydrogen concentration is sufficiently reduced can be manufactured. Further, impurities in the layer being in contact with the oxide semiconductor layer are reduced; thus the oxide semiconductor layer can be kept highly purified. In such a semiconductor element using the highly purified oxide semiconductor layer, off-state current is reduced, and a semiconductor device with low power consumption can be realized.

Embodiment 3

In this embodiment, a method for manufacturing a transistor having a different structure from the transistor described in Embodiment 2 by using an apparatus for successive deposition described in Embodiment 1 will be described with reference to FIG. 1, FIG. 3B, and FIGS. 5A to 5E. In this embodiment, a method for manufacturing a semiconductor element using an oxide semiconductor layer will be described.

Figure 3B:
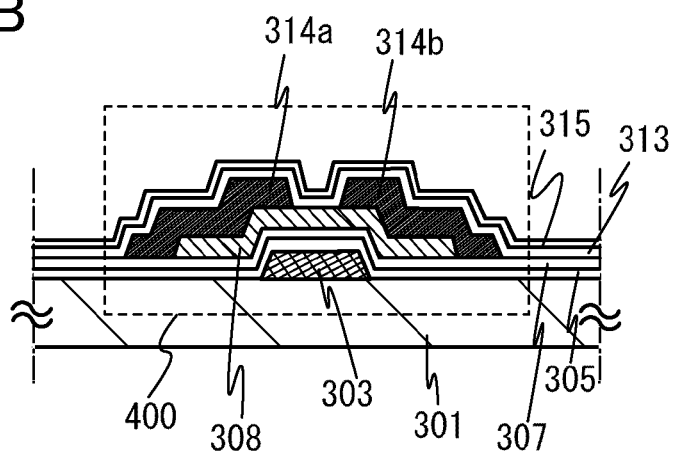

A cross-sectional view of a bottom gate transistor in this embodiment is illustrated in FIG. 3B. A transistor 400 includes the gate electrode layer 303, the first gate insulating layer 305, the second gate insulating layer 307, a highly purified oxide semiconductor layer 308, a source electrode layer 314a, a drain electrode layer 314b, the insulating layer 313, and the protective insulating layer 315.

A method for manufacturing the transistor 400 using the deposition apparatus in Embodiment 1 will be described with reference to FIGS. 5A to 5E. First, in a manner similar to that in Embodiment 2, the gate electrode layer 303 is formed over the substrate 301 (FIG. 5(A)).

Figure 5A:
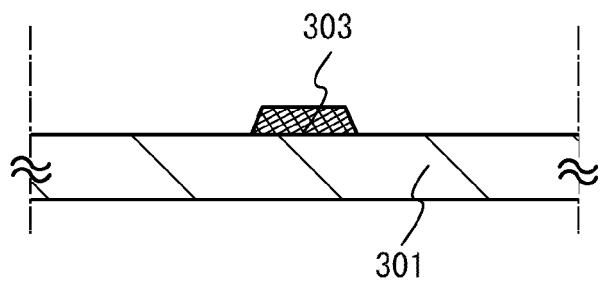
FIGS. 5A to 5E are diagrams illustrating a method for manufacturing a transistor according to one embodiment of the present invention.
Figure 5B:
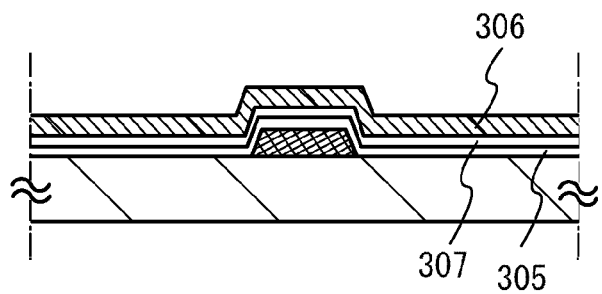

Next, using the apparatus for successive deposition in Embodiment 1 (see FIG. 1), the gate insulating layer (the first gate insulating layer 305 and the second gate insulating layer 307) and the oxide semiconductor film 306 are deposited successively without being exposed to the air (FIG. 5(B)). The gate insulating layer and the oxide semiconductor film 306 are deposited in a manner similar to that in Embodiment 2.

Figure 5C:
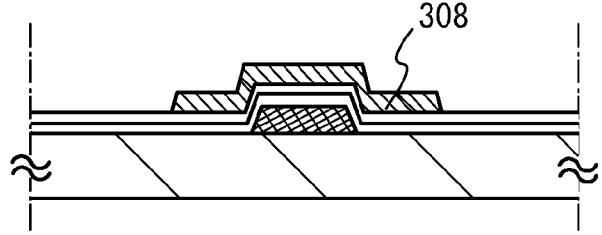

Next, the oxide semiconductor film 306 is processed into an island-shaped oxide semiconductor layer 308 in a photolithography step (FIG. 5C). The resist mask for forming the oxide semiconductor layer 308 may be formed by an inkjet method. Formation of the resist mask by an inkjet method needs no photomask; thus, manufacturing cost can be reduced.

For this etching of the oxide semiconductor film 309, wet etching, dry etching, or both of them may be employed. As an etchant used for wet etching of the oxide semiconductor film 309, for example, a mixed solution of phosphoric acid, acetic acid, and nitric acid, or the like can be used. In addition, ITO07N (produced by KANTO CHEMICAL CO., INC.) may also be used.

Figure 5D:
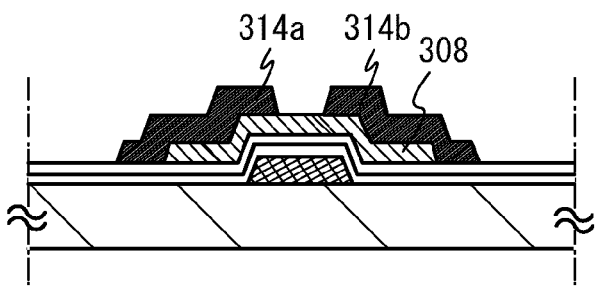

Next, as illustrated in FIG. 5D, a conductive film is deposited over the second gate insulating layer 307 and the oxide semiconductor layer 308 by a sputtering method. As in the case where the oxide semiconductor film 306 is formed, the pressure in the deposition chamber for depositing the conductive film is kept at $10^{-8}$ Pa or less using an evacuation unit such as a cryopump before and after the deposition. Next, a resist mask is formed over the conductive film through a photolithography step and selective etching is performed, so that the source electrode layer 311a and the drain electrode layer 311b are formed.

After that, by plasma treatment using a gas such as $N_2O$, $N_2$, or Ar, water or the like adsorbed to a surface of an exposed portion of the oxide semiconductor layer may be removed.

Then, in a manner similar to that in Embodiment 2, a silicon oxide film is formed as the insulating layer 313 and a silicon nitride film is formed as the protective insulating layer 315.

Figure 5E:
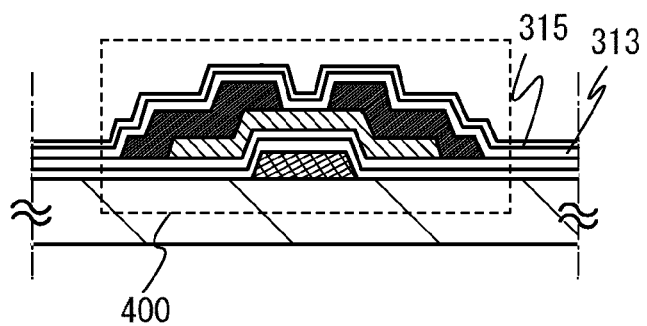

Through the above process, the transistor 400 is formed (FIG. 5E).

As described above, by manufacturing a transistor using an apparatus for successive deposition in Embodiment 1, impurities are not mixed into the oxide semiconductor layer and a layer being in contact with the oxide semiconductor layer, whereby a semiconductor element including a high-purity oxide semiconductor layer in which hydrogen concentration is sufficiently reduced can be manufactured. Further, impurities in the gate insulating film and the conductive film which are in contact with the oxide semiconductor layer are reduced; thus the oxide semiconductor layer can be kept highly purified. In such a semiconductor element using the highly purified oxide semiconductor layer, off-state current is reduced, and a semiconductor device with low power consumption can be realized.

Embodiment 4

In this embodiment, a method for manufacturing a transistor having a different structure from the semiconductor element described in Embodiments 2 and 3 by using an apparatus for successive deposition described in Embodiment 1 will be described with reference to FIG. 1, FIG. 3C, and FIGS. 6A to 6E. In this embodiment, a method for manufacturing a transistor using an oxide semiconductor layer having a crystal region will be particularly described.

Figure 3C:
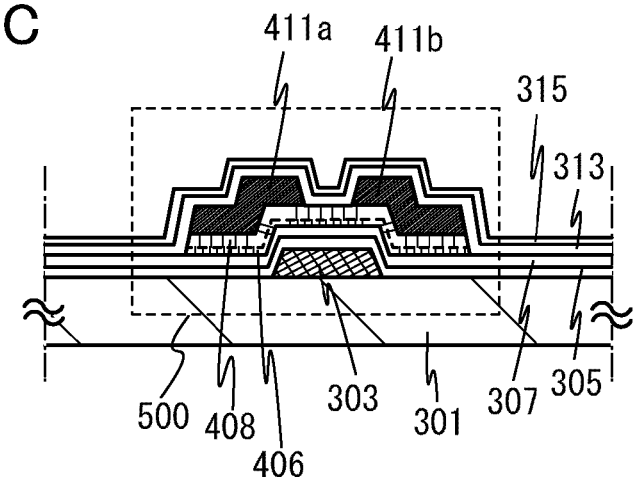

A cross-sectional view of a transistor whose manufacturing method is described in this embodiment will be illustrated in FIG. 3C. A transistor 500 includes the gate electrode layer 303, the first gate insulating layer 305, the second gate insulating layer 307, a first oxide semiconductor layer 406, a second oxide semiconductor layer 408, a source electrode layer 411a, a drain electrode layer 411b, the insulating layer 313, and the protective insulating layer 315. Note that the first oxide semiconductor layer 406 and the second oxide semiconductor layer 408 are crystallized.

A method for manufacturing the transistor 500 using the deposition apparatus in Embodiment 1 will be described with reference to FIGS. 6A to 6E. First, a conductive film is formed over the substrate 301, and then, the gate electrode layer 303 is formed by a first photolithography step.

Figure 6A:
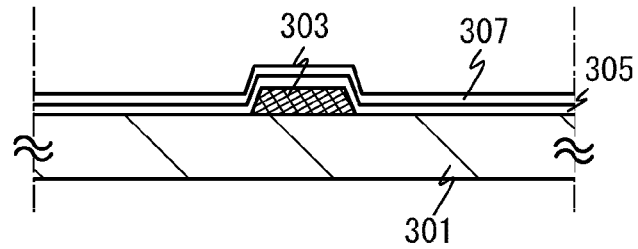
FIGS. 6A to 6E are diagrams illustrating a method for manufacturing a transistor according to one embodiment of the present invention.

Next, using the apparatus for successive deposition (see FIG. 1) in Embodiment 1, the first gate insulating layer 305 and the second gate insulating layer 307 are formed (FIG. 6A).

Next, the substrate 301 is transferred from the second deposition chamber 115 to the third deposition chamber 117, and an oxide semiconductor layer having a crystal region is formed over the second gate insulating layer 307. The oxide semiconductor layer having a crystal region with a large film thickness, that is, a c-axis-aligned crystal region (a crystal region aligned in a direction perpendicular to a surface of the film) may be formed by performing deposition twice and heat treatment twice. By using such a method, a crystal region can be formed in the oxide semiconductor regardless of the material for a base component such as an oxide, a nitride, a metal, or the like.

The first oxide semiconductor film is deposited by a sputtering method. The pressure in the third deposition chamber 117 is kept at $10^{-8}$ Pa or less using the evacuation unit 1117 such as a cryopump before and after the deposition.

As the oxide semiconductor used for the first oxide semiconductor film, the oxide semiconductor described in Embodiment 2 can be used.

The first oxide semiconductor film is used as a seed crystal for crystal growth of the second oxide semiconductor film which is formed later. Therefore, the first oxide semiconductor film may have a thickness with which crystal growth is possible, typically greater than or equal to a thickness of one atomic layer and less than or equal to 30 nm, preferably greater than or equal to 2 nm to 5 nm. When the first oxide semiconductor film 405 is thin, throughput in deposition treatment and heat treatment can be improved.

Figure 6B:
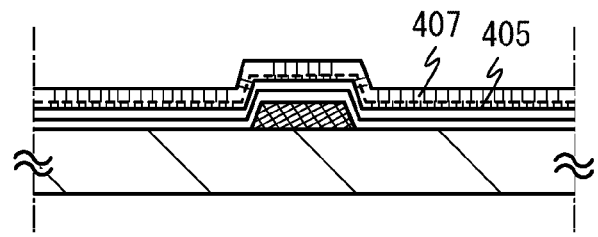

Next, the substrate 301 is transferred from the third deposition chamber 117 to the first heating chamber 119, and subjected to the first heat treatment; accordingly, a crystal region (including a plate-like crystal) is formed in a region including a surface of the first oxide semiconductor film. By the first heat treatment, the first oxide semiconductor film 405 including the crystal region (including a plate-like crystal) can be formed in the region including the surface of the first oxide semiconductor film (FIG. 6B).

The first heat treatment is performed in an atmosphere of nitrogen, oxygen, a rare gas, or dry air. In the first heat treatment, a temperature from 450° C. to 850° C. inclusive, preferably from 550° C. to 750° C. inclusive is employed. In addition, heating time is longer than or equal to 1 minute and shorter than or equal to 24 hours. The pressure in the first heating chamber 119 is kept at $10^{-8}$ Pa or less using the evacuation unit 1119 such as a cryopump before and after the heat treatment.

It is preferable that the first heating chamber 119 have a heating unit which can heat a substrate at room temperature to 850° C. inclusive.

Note that in the case where the third deposition chamber 117 has a substrate heating unit, by depositing the first oxide semiconductor film while heating the substrate, crystal growth can be promoted. Crystals in the first oxide semiconductor layer are grown during the deposition, whereby the first heat treatment can be omitted. For a substrate heating condition, the substrate 301 may be heated at room temperature to 500° C. inclusive.

Next, the substrate is transferred from the first heating chamber 119 to the fourth deposition chamber 121, and the second oxide semiconductor film that is thicker than the first oxide semiconductor film is formed by a sputtering method. Note that the pressure in the fourth deposition chamber 121 is kept at $10^{-8}$ Pa or less using an evacuation unit 1121 such as a cryopump before and after the deposition.

As an oxide semiconductor used for the second oxide semiconductor film, the oxide semiconductor described in Embodiment 2 can be used.

Note that an appropriate thickness of the second oxide semiconductor film may be determined by a practitioner depending on a device to be manufactured.

In the case where the fourth deposition chamber 121 has a substrate heating unit, the second oxide semiconductor film may be formed while heating the substrate.

By using the apparatus for successive deposition in Embodiment 1, for example, the first oxide semiconductor film with a thickness of greater than or equal to 2 nm and less than or equal to 30 nm can be deposited in 10 minutes while being heated in the deposition chamber 117, and then, the second oxide semiconductor film with a thickness of greater than or equal to 20 nm and less than or equal to 200 nm can be successively deposited in 10 minutes in the fourth deposition chamber 121.

Next, the substrate 301 is transferred from the fourth deposition chamber 121 to the second heating chamber 123, and the second heat treatment is performed. The pressure in the second heating chamber 123 is kept at $10^{-8}$ Pa or less using an evacuation unit 1123 such as a cryopump before and after the heat treatment.

Next, the second heat treatment is performed at 450° C. to 850° C. inclusive, preferably at 600° C. to 700° C. inclusive. Crystal growth proceeds upward with the use of the first oxide semiconductor film 405 as a seed crystal for the crystal growth and the whole second oxide semiconductor film is crystallized. In such a manner, the second oxide semiconductor film 407 having a crystal region with a large film thickness is formed (FIG. 6B).

Note that the boundary between the first oxide semiconductor film 405 and the second oxide semiconductor film 407 having a crystal region is shown by a dashed line in FIGS. 6A to 6E; however, the boundary between the first oxide semiconductor layer 405 and the second oxide semiconductor layer 407 having a crystal region cannot be determined and the first oxide semiconductor layer 405 and the second oxide semiconductor layer 407 can be regarded to as one layer in some cases.

Further, after the first oxide semiconductor film 405 and the second oxide semiconductor film 407 are formed, oxygen radical treatment is preferably performed on the surface of the second oxide semiconductor film. In this embodiment, oxygen radical treatment is performed in the treatment chamber 125. Before and after the treatment, the pressure in the second heating chamber 125 is kept at $10^{-8}$ Pa or less using the evacuation unit 1125 such as a cryopump. The oxygen radical treatment can be performed in a manner similar to that in Embodiment 2.

Figure 6C:
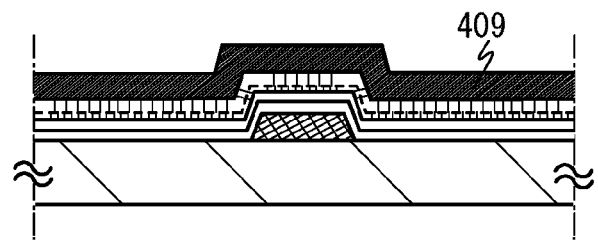

Next, the substrate 301 is transferred to the fifth deposition chamber 127, and a conductive film 409 is deposited over the second oxide semiconductor film 407 by a sputtering method (FIG. 6C). The conductive film 409 can be formed using a material and a method similar to those of the conductive film 310 in Embodiment 2. Thus, Embodiment 2 can be referred to for the details. In addition, before and after the deposition, the pressure in the fifth deposition chamber 127 is kept at $10^{-8}$ Pa or less using the evacuation unit 1127 such as a cryopump, and the inside of the fifth deposition chamber 127 is kept extremely clean.

The substrate 301 that has been subjected to successive deposition is transferred to the second load lock chamber 131.

Figure 6D:
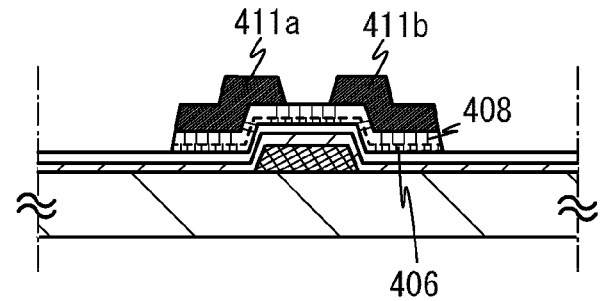

In a manner similar to that in Embodiment 2, the first oxide semiconductor layer 406, the second oxide semiconductor layer 408, the source electrode layer 411a, and the drain electrode layer 411b are formed by a photolithography step using the second photomask and by etching (FIG. 6D).

Next, using a material and a method similar to those described in Embodiment 2, a silicon oxide film is formed as the insulating layer 313 and a silicon nitride film is formed as the protective insulating layer 315.

Figure 6E:
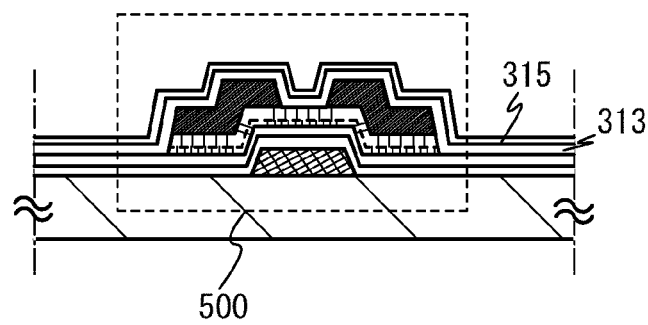

Through the above-described steps, the transistor 500 using an oxide semiconductor layer having a crystal region can be manufactured (FIG. 6E).

Note that in this embodiment, the case where the oxide semiconductor film has two layers is described; however, the oxide semiconductor layer having a crystal region may have a single layer or three or more layers.

In the case where a single layer oxide semiconductor film is deposited, for example, an oxide semiconductor film may be formed in the third deposition chamber 117, and heat treatment may be performed in the first heating chamber 119. Further, the substrate 301 may be subjected to deposition while being heated so that crystal growth can be promoted; alternatively, oxygen radical treatment may be performed on the deposited oxide semiconductor film in the treatment chamber 125.

Note that in the case where a transistor is formed by the steps of processing an oxide semiconductor film having a crystal region into an island-shaped oxide semiconductor layer having a crystal region and forming a conductive film thereover, the method described in Embodiment 3 can be applied except for the formation of the oxide semiconductor film. Therefore, Embodiment 3 can be referred to for the details.

Accordingly, by using the deposition apparatus capable of successive deposition in Embodiment 1, which keeps its inside in high vacuum state, and thus allows films to be deposited without being exposed to the air, the entry of impurities such as hydrogen into the oxide semiconductor layer and the layer being in contact with the oxide semiconductor layer can be prevented; as a result, a semiconductor element including a high-purity oxide semiconductor layer in which hydrogen concentration is sufficiently reduced can be manufactured. In such a semiconductor element, off-state current is low, and a semiconductor device with low power consumption can be realized.

This application is based on Japanese Patent Application serial no. 2010-043575 filed with Japan Patent Office on Feb. 26, 2010, the entire contents of which are hereby incorporated by reference.

The invention claimed is:

1. A method for manufacturing a semiconductor element comprising the steps of:
   transferring a substrate into a load lock chamber;
   evacuating the load lock chamber to have a pressure of $10^{-6}$ Pa or less;
   transferring the substrate into a heating chamber evacuated to have a pressure of $10^{-8}$ Pa or less;
   performing a heat treatment on the substrate after evacuating the heating chamber to have the pressure of $10^{-8}$ Pa or less;
   transferring the substrate into a first deposition chamber evacuated to have a pressure of $10^{-8}$ Pa or less;
   introducing a first gas into the first deposition chamber;
   forming a gate insulating film over the substrate;

evacuating the first deposition chamber to have a pressure of $10^{-8}$ Pa or less;

transferring the substrate into a second deposition chamber evacuated to have a pressure of $10^{-8}$ Pa or less;

introducing a second gas into the second deposition chamber;

forming an oxide semiconductor film over the gate insulating film; and evacuating the second deposition chamber to have a pressure of $10^{-8}$ Pa or less after forming the oxide semiconductor film.

2. The method for manufacturing a semiconductor element according to claim 1, wherein the first and second gases are high-purity sputtering gases.

3. The method for manufacturing a semiconductor element according to claim 1, further comprising the steps of:
transferring the substrate into a treatment chamber evacuated to have a pressure of $10^{-8}$ Pa or less after the oxide semiconductor film is formed; and
performing an oxygen radical treatment on the oxide semiconductor film.

4. The method for manufacturing a semiconductor element according to claim 1, wherein the oxide semiconductor film with a thickness of greater than or equal to 2 nm and less than or equal to 200 nm is formed in 10 minutes.

5. A method for manufacturing a semiconductor element comprising the steps of:
transferring a substrate into a load lock chamber;
evacuating the load lock chamber to have a pressure of $10^{-6}$ Pa or less;
transferring the substrate into a heating chamber evacuated to have a pressure of $10^{-8}$ Pa or less;
performing a heat treatment on the substrate after evacuating the heating chamber to have the pressure of $10^{-8}$ Pa or less;
transferring the substrate into a first deposition chamber evacuated to have a pressure of $10^{-8}$ Pa or less;
introducing a first gas into the first deposition chamber;
forming an oxide semiconductor film over the substrate;
evacuating the first deposition chamber to have a pressure of $10^{-8}$ Pa or less after forming the oxide semiconductor film;
transferring the substrate into a second deposition chamber evacuated to have a pressure of $10^{-8}$ Pa or less;
introducing a second gas into the second deposition chamber; and
forming a conductive film over the oxide semiconductor film.

6. The method for manufacturing a semiconductor element according to claim 5, wherein the first and second gases are high-purity sputtering gases.

7. The method for manufacturing a semiconductor element according to claim 5, further comprising the steps of:
transferring the substrate into a treatment chamber evacuated to have a pressure of $10^{-8}$ Pa or less after the oxide semiconductor film is formed; and
performing an oxygen radical treatment on the oxide semiconductor film.

8. The method for manufacturing a semiconductor element according to claim 5, wherein the oxide semiconductor film with a thickness of greater than or equal to 2 nm and less than or equal to 200 nm is formed in 10 minutes.

9. A method for manufacturing a semiconductor element comprising the steps of:
transferring a substrate into a load lock chamber;
evacuating the load lock chamber to have a pressure of $10^{-6}$ Pa or less;
transferring the substrate into a heating chamber evacuated to have a pressure of $10^{-8}$ Pa or less;
performing a heat treatment on the substrate after evacuating the heating chamber to have the pressure of $10^{-8}$ Pa or less;
transferring the substrate into a first deposition chamber evacuated to have a pressure of $10^{-8}$ Pa or less;
introducing a first gas into the first deposition chamber;
forming a gate insulating film over the substrate;
evacuating the first deposition chamber to have a pressure of $10^{-8}$ Pa or less;
transferring the substrate into a second deposition chamber evacuated to have a pressure of $10^{-8}$ Pa or less;
introducing a second gas into the second deposition chamber;
forming an oxide semiconductor film over the gate insulating film;
evacuating the second deposition chamber to have a pressure of $10^{-8}$ Pa or less after forming the oxide semiconductor film;
transferring the substrate into a third deposition chamber evacuated to have a pressure of $10^{-8}$ Pa or less;
introducing a third gas into the third deposition chamber; and
forming a conductive film over the oxide semiconductor film.

10. The method for manufacturing a semiconductor element according to claim 9, wherein the first, second and third gases are high-purity sputtering gases.

11. The method for manufacturing a semiconductor element according to claim 9, further comprising the steps of:
transferring the substrate into a treatment chamber evacuated to have a pressure of $10^{-8}$ Pa or less after the oxide semiconductor film is formed; and
performing an oxygen radical treatment on the oxide semiconductor film.

12. The method for manufacturing a semiconductor element according to claim 9, wherein the oxide semiconductor film with a thickness of greater than or equal to 2 nm and less than or equal to 200 nm is formed in 10 minutes.

* * * * *